(12) United States Patent
Vaartstra

(10) Patent No.: US 7,273,525 B2
(45) Date of Patent: Sep. 25, 2007

(54) METHODS FOR FORMING PHOSPHORUS- AND/OR BORON-CONTAINING SILICA LAYERS ON SUBSTRATES

(75) Inventor: Brian A Vaartstra, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 292 days.

(21) Appl. No.: 10/436,640

(22) Filed: May 13, 2003

(65) Prior Publication Data

US 2003/0200925 A1 Oct. 30, 2003

Related U.S. Application Data

(60) Continuation of application No. 09/649,560, filed on Aug. 28, 2000, now abandoned, which is a division of application No. 09/146,622, filed on Sep. 3, 1998, now Pat. No. 6,136,703.

(51) Int. Cl.
*C30B 1/02* (2006.01)

(52) U.S. Cl. .............. 117/89; 117/90; 117/94; 117/4; 117/5; 117/6

(58) Field of Classification Search ............... 117/89, 117/90, 94, 4, 5, 6
See application file for complete search history.

(56) References Cited

U.S. PATENT DOCUMENTS

| | | | |
|---|---|---|---|
| 4,167,915 A | 9/1979 | Toole et al. | |
| 4,369,031 A | 1/1983 | Goldman et al. | |
| 5,160,543 A | 11/1992 | Ishihara et al. | |
| 5,190,913 A | 3/1993 | Higashiyama et al. | |
| 5,262,356 A * | 11/1993 | Fujii | 438/488 |
| 5,364,667 A | 11/1994 | Rhieu | |
| 5,391,232 A | 2/1995 | Kanai et al. | |
| 5,433,786 A | 7/1995 | Hu et al. | |
| 5,453,494 A | 9/1995 | Kirlin et al. | |
| 5,532,193 A | 7/1996 | Maeda et al. | |
| 5,558,717 A | 9/1996 | Zhao et al. | |
| 5,643,640 A | 7/1997 | Chakravarti et al. | |
| 5,653,807 A | 8/1997 | Crumbaker | |
| 5,707,451 A | 1/1998 | Robles et al. | |
| 5,710,079 A * | 1/1998 | Sukharev | 438/778 |
| 5,759,923 A * | 6/1998 | McMillan et al. | 438/788 |
| 5,777,300 A * | 7/1998 | Homma et al. | 219/679 |
| 5,853,607 A | 12/1998 | Zhao et al. | |
| 5,902,403 A | 5/1999 | Aitani et al. | |
| 5,915,200 A | 6/1999 | Tokumasu et al. | |
| 5,993,555 A | 11/1999 | Hamilton | |
| 6,071,349 A | 6/2000 | Kurosawa et al. | |
| 6,086,952 A | 7/2000 | Lang et al. | |
| 6,098,568 A | 8/2000 | Raoux et al. | |
| 6,121,164 A | 9/2000 | Yieh et al. | |
| 6,136,703 A * | 10/2000 | Vaartstra | 438/680 |
| 6,182,603 B1 | 2/2001 | Shang et al. | |
| 6,244,575 B1 | 6/2001 | Vaartstra | |
| 6,294,466 B1 | 9/2001 | Chang | |

OTHER PUBLICATIONS

Dobson et al., "Advanced $SiO_2$ planarization using silane and $H_2O_2$," *Semiconductor International*, Dec. 1994; 88:85-86.
Gaillard et al., "Silicon dioxide chemical vapor deposition using silane and hydrogen peroxide," *J. Vac. Sci. Technol.*, 1996, Jul./Aug. 1996; 14(4):2767-9.
Versteeg et al., "Metalorganic chemical vapor deposition by pulsed liquid injection using an ultrasonic nozzle: titanium dioxide on sapphire from titanium (IV) isopropoxide," *J. Am. Ceram. Soc.*, 1995; 78(10):2763-8.
Webster's II New Riverside University Dictionary, 1984; p. 1276.
Webster's New Collegiate Dictionary, 1979; p. 1284.
Webster's New Collegiate Dictionary, G. & C. Merriam Co., 1979, pp. 760-761, title page, and publication page (4 pages total).

* cited by examiner

*Primary Examiner*—Robert Kunemund
(74) *Attorney, Agent, or Firm*—Mueting, Raasch & Gebhardt, P.A.

(57) ABSTRACT

A method of forming a phosphorus- and/or boron-containing silica layer, such as a PSG, BSG, or BPSG layer, on a substrate, such as a semiconductor substrate or substrate assembly.

31 Claims, 1 Drawing Sheet

METHODS FOR FORMING PHOSPHORUS- AND/OR BORON-CONTAINING SILICA LAYERS ON SUBSTRATES

This application is a continuation of Ser. No. 09/649,560, filed Aug. 28, 2000, now abandoned, which is a divisional of Ser. No. 09/146,622 filed Sep. 3, 1998 now U.S. Pat. No. 6,136,703

FIELD OF THE INVENTION

This invention relates to the preparation of silica layers on substrates, particularly semiconductor device structures. The silica layers are phosphorus- and/or boron-containing silica layers.

BACKGROUND OF THE INVENTION

The formation of $SiO_2$ layers that fill high aspect ratio gaps (e.g., vertical shallow trenches, contacts, vias, etc.) without voids and are capable of a high degree of planarity is becoming extremely important in advanced dynamic random access memory devices (DRAMS). This is because the geometries are getting very small and high integrity interlayer dielectrics are needed.

Conventional methods of depositing $SiO_2$ involve low pressure, and even subatmospheric, chemical vapor deposition as well as plasma-enhanced chemical vapor deposition to avoid the appearance of voids. These methods, however, are not completely successful. That is, voids can still form, particularly in vertical trenches.

Gaillard et al., *J. Vac. Sci. Technol. B*, 14, 2767-2769 (1996) describe an improved method that involves the formation of a liquid to completely fill high aspect ratio gaps with a homogeneous $SiO_2$ layer. This method forms liquid $Si(OH)_x(O)_y(H_2O)_z$ from the gas phase using chemical vapor deposition (CVD) of a mixture of $SiH_4$, $H_2O$, and $H_2O_2$. The liquid material forms a planar surface by surface tension. It then polymerizes to hydrated silica and is further densified to amorphous $SiO_2$ by annealing. This is referred to as a $SiO_2$ "FLOWFILL" method. However, this method is not as versatile as is desired with respect to etch rate and/or selectivity with respect to other oxide or nitride layers.

Thus, there is a continuing need for methods that provide layers on surfaces having small high aspect ratio openings that have few, if any, voids and have different and/or improved planarization and etch characteristics relative to conventionally formed $SiO_2$ layers, particularly in advanced dynamic random access memory devices.

SUMMARY OF THE INVENTION

The present invention generally involves the incorporation of phosphorus and/or boron into $SiO_2$ "FLOWFILL" technology, which forms liquid $Si(OH)_x(O)_y(H_2)_z$ and oligomers thereof. The incorporation of phosphorus and/or boron allows for tailoring of the flow characteristics of the liquid $Si(OH)_x(O)_y(H_2)_z$ and oligomers thereof, as well as the etching rates and dielectric constants of the resultant solid silica layers.

Specifically, the present invention is directed to methods for forming silica layers on substrates, particularly in the manufacture of a semiconductor device, such as a dynamic random access memory device. The methods involve forming phosphorus- and/or boron-containing layers on substrates, such as semiconductor substrates or substrate assemblies during the manufacture of semiconductor structures. The phosphorus- and/or boron-containing silica layers include BSG, PSG, or BPSG layers.

A preferred method of the present invention involves forming a layer on a substrate, such as a semiconductor substrate or substrate assembly during the manufacture of a semiconductor structure, by: providing a substrate (preferably, a semiconductor substrate or substrate assembly, preferably having one or more small high aspect ratio openings); providing one or more silicon sources in the form of a liquid or a gas (preferably, one or more compounds of the formula $SiX_pY_{4-p}$, wherein X=halide or hydrogen, Y=hydrogen, $R^1$, or $OR^2$, wherein each $R^1$ and $R^2$ group is independently an organic group, and p=0-4, which are typically gases at room temperature, but may be liquids); providing one or more sources of a nonsilicon-containing reaction gas in the form of a liquid or a gas (preferably, $H_2O$, $H_2O_2$, or a mixture thereof); providing one or more liquid compounds of the formulas $B(OR^3)_3$, $P(OR^4)_3$, $(O)P(OR^5)_3$, wherein each $R^3$, $R^4$, and $R^5$ group is independently an alkyl group or an alkenyl group (which includes providing the compounds individually or as mixtures); vaporizing each of the compounds provided as liquids to form gases (e.g., $SiX_pY_{4-p}$ if necessary, typically $H_2O$ and/or $H_2O_2$, as well as $B(OR^3)_3$, $P(OR^4)_3$, and/or $(O)P(OR^5)_3$); directing the gases (whether from the vaporized liquids or the materials provided as gases) toward the substrate to form a condensed liquid on a surface of the substrate; and thermally treating the condensed liquid to form a phosphorus and/or boron-containing silica layer. Such layers are substantially homogeneous, i.e., they do not contain a significant number of voids or cracks that can detrimentally affect their function.

Methods of the present invention are particularly well suited for forming layers on a surface of a semiconductor substrate or substrate assembly, such as a silicon wafer, having high surface area topology, such as high aspect ratio openings formed therein, used in forming integrated circuits. It is to be understood that methods of the present invention are not limited to deposition on silicon wafers; rather, other types of wafers (e.g., gallium arsenide wafer, etc.) can be used as well. Also, the methods of the present invention can be used in silicon-on-insulator technology. Furthermore, substrates other than semiconductor substrates or substrate assemblies can be used in methods of the present invention. These include, for example, fibers, wires, etc. If the substrate is a semiconductor substrate or substrate assembly, the layers can be formed directly on the lowest semiconductor surface of the substrate, or they can be formed on any of a variety of the layers (i.e., surfaces) as in a patterned wafer, for example. Thus, the term "semiconductor substrate" refers to the base semiconductor layer, e.g., the lowest layer of silicon material in a wafer or a silicon layer deposited on another material such as silicon on sapphire. The term "semiconductor substrate assembly" refers to the semiconductor substrate having one or more layers or structures formed thereon.

A chemical vapor deposition apparatus is also provided. The apparatus includes a deposition chamber having a substrate positioned therein; one or more vessels containing one or more compounds of the formulas $B(OR^3)_3$, $P(OR^4)_3$, $(O)P(OR^5)_3$, as described above (which includes providing the compounds individually or as mixtures); one or more sources of silicon in the form of a liquid or a gas (preferably, this includes one or more sources of a silicon-containing gas such as $SiH_4$); one or more sources of a nonsilicon-containing reaction gas in the form of a liquid or a gas (preferably, this includes one or more sources of $H_2O$, $H_2O_2$, or a mixture thereof); and optionally one or more sources of an inert carrier gas for transferring the liquid compounds (e.g., $B(OR^3)_3$, $P(OR^4)_3$, and/or $(O)P(OR^5)_3$) to the chemical vapor deposition chamber.

DETAILED DESCRIPTION OF PREFERRED EMBODIMENTS

Figure 1:
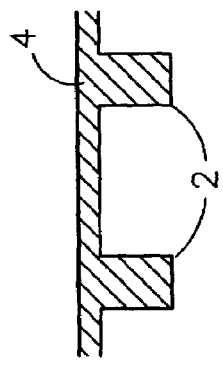
FIG. 1 is a cross-section of trenches used in shallow trench isolation applications (STI) filled with a boron- and/or phosphorus-containing silica layer made according to methods of the present invention.

The present invention provides methods of forming a phosphorus- and/or boron-containing silica layer using a chemical vapor deposition technique and a source of silicon, a source of boron and/or phosphorus, and a source of a nonsilicon-containing reaction gas (i.e., a gas that does not include silicon atoms) as the reactants (i.e., precursor compounds). These compounds are chosen such that they form a hydroxylated liquid mixture containing silicon, boron, and/or phosphorus on a substrate surface during a deposition process. This liquid layer is then thermally treated to form a boron- and/or phosphorus-containing silica layer, such as BSG, PSG, or BPSG. This includes $SiO_2$ with varying quantities of boron and/or phosphorus dopants, each typically present at a concentration of about 0.5 weight percent to about 10 weight percent, and preferably, about 1 weight percent to about 5 weight percent.

Specifically, the present invention is directed to methods of manufacturing a semiconductor device, particularly a DRAM, having a phosphorus- and/or boron-containing silica layer. Significantly, such layers are substantially homogeneous in that they do not contain a significant number of voids or cracks that would detrimentally affect the performance of the layers. Using the methods of the present invention, the phosphorus- and/or boron-containing silica layers formed can be tailored to have varying etch characteristics and dielectric characteristics, for example.

Preferred embodiments involve the use of one or more compounds of the formula $SiX_pY_{4-p}$, as a source of silicon, wherein X=halide or hydrogen, Y=hydrogen, $R^1$, or $OR^2$, wherein each $R^1$ and $R^2$ group is independently an organic group, and $H_2O$, $H_2O_2$, or a mixture thereof, in addition to one or more complexes of the formulas $B(OR^3)_3$, $P(OR^4)_3$, $(O)P(OR^5)_3$, wherein each $R^3$, $R^4$, and $R^5$ group is independently an alkyl group or an alkenyl group.

Compounds of the formula $SiX_pY_{4-p}$ suitable for use in the methods of the present invention are typically gases at room temperature (i.e., about 20° C. to about 25° C.), although some may be volatile liquids. Complexes of the formulas $B(OR^3)_3$, $P(OR^4)_3$, $(O)P(OR^5)_3$ suitable for use in the methods of the present invention are volatile liquids at room temperature. Thus, such complexes described herein are suitable for use in chemical vapor deposition (CVD) techniques, such as flash vaporization techniques, bubbler techniques, and/or microdroplet techniques. Preferred embodiments of the complexes described herein are particularly suitable for condensation and hydrolysis at low temperatures (e.g., 0° C. to 50° C.), followed by facile elimination of by-products with thermal treatment. Preferably, temperatures of about 200° C. to about 300° C. are used to drive off water. Following, this, temperatures of about 700° C. to about 1000° C. are preferably used to densify the layer.

One preferred method of the present invention involves introducing one or more complexes selected from the group of $B(OR^3)_3$, $P(OR^4)_3$, and $(O)P(OR^5)_3$, and mixtures thereof, as defined herein. Typically, these are introduced from separate vessels (e.g., bubblers) and then combined in the vapor phase. A source of silicon, particularly one or more compounds of the formula $SiX_pY_{4-p}$ as defined herein, is also introduced, typically as a gas, and combined in the vapor phase with a nonsilicon-containing reaction gas, such as vaporized $H_2O$ and/or $H_2O_2$ ($H_2O_2$ is typically provided as a solution of $H_2O_2$ in $H_2O$). The silicon-containing gas, the nonsilicon-containing reaction gas, and the vaporized phosphorus- and/or boron-containing compounds are then combined prior to contact with a substrate surface. These are referred to herein as "precursor vapors" or "reactant gases" (which can include nonsilicon-containing reaction gases). Alternatively, however, the phosphorus- and/or boron-containing complexes can be combined with the source of silicon prior to any of them being vaporized. The entire mixture can then be vaporized and combined with the vapor of $H_2O$ and/or $H_2O_2$, for example, prior to contact with a substrate surface. Other schemes by which the three types of reactants or precursor compounds can be combined are also possible.

Any of the liquid precursor compounds can be vaporized in the presence of one or more nonsilicon-containing reaction gases and optionally one or more inert carrier gases. The inert carrier gas is typically selected from the group consisting of nitrogen, helium, argon, and mixtures thereof. In the context of the present invention, an inert carrier gas is one that is generally unreactive with the complexes described herein and does not interfere with the formation of a phosphorus- and/or boron-containing silica layer. The nonsilicon-containing reaction gas (i.e., one that does not include silicon atoms) can be selected from a wide variety of gases reactive with the silicon-containing compounds and/or the phosphorus- or boron-containing complexes described herein, at least at a surface under the conditions of chemical vapor deposition. Examples of reaction gases include oxidizing compounds, such as $O_2$, $O_3$, $N_2O$, $NO_2$, NO, $H_2O$, and $H_2O_2$, including mixtures of such compounds. Preferably, $H_2O$, $H_2O_2$, or mixtures thereof are used. These reaction gases can be initially provided as liquids (e.g., $H_2O$ or $H_2O_2$ dissolved in $H_2O$ at room temperature), which can then be subjected to vaporization conditions to volatilize them during the methods of the present invention.

Suitable phosphorus and boron complexes are of the formulas $B(OR^3)_3$, $P(OR^4)_3$, and $(O)P(OR^5)_3$, wherein each R group ($R^3$, $R^4$, $R^5$) is independently an alkyl or alkenyl group. Preferably, each R group is a ($C_1$-$C_8$) alkyl or alkenyl group. More preferably, each of these R groups is independently a ($C_1$-$C_5$) alkyl or alkenyl group. Most preferably, each of these R groups is a ($C_1$-$C_4$) alkyl or alkenyl moiety.

Suitable silicon sources are those that are capable of vaporization (if liquids at room temperature) and formation of a condensed liquid (which may include compounds of the formula $Si(OH)_xO_y(H_2O)_z$ and oligomers thereof, although this is not a necessary requirement) on the surface of a substrate during a deposition process under CVD conditions, such as those described in Gaillard et al., *J. Vac. Sci. Technol. B*, 14, 2767-2769 (1996), for example. Preferred such compound are of the formula $SiX_pY_{4-p}$, wherein X=halide (preferably, Cl) or hydrogen, Y=hydrogen, $R^1$, or $OR^2$, wherein each $R^1$ and $R^2$ group is independently an organic group. This can include linear, branched, or cyclic organic structures. Also, any two $R^1$ groups may be joined to form a ring or rings. Preferably, each $R^1$ and $R^2$ group is independently a ($C_1$-$C_8$) organic group, more preferably, a ($C_1$-$C_5$) organic group, and most preferably, a ($C_1$-$C_4$) organic group. For particularly preferred embodiments, each $R^1$ and $R^2$ group is independently an alkyl or alkenyl moiety. Preferably, these compounds are gases at room temperature, although some may be volatile liquids.

As used herein, the term "organic group" means a hydrocarbon group (with optional elements other than carbon and hydrogen, such as oxygen, nitrogen, sulfur, and silicon) that is classified as an aliphatic group, cyclic group, or combination of aliphatic and cyclic groups (e.g., alkaryl and aralkyl groups). In the context of the present invention, the organic groups are those that do not interfere with the formation of a phosphorus- and/or boron-containing silica layer. Preferably, they are of a type and size that do not interfere with the formation of a phosphorus- and/or boron-containing layer using chemical vapor deposition techniques. The term "aliphatic group" means a saturated or unsaturated linear or branched hydrocarbon group. This term is used to encompass alkyl, alkenyl, and alkynyl groups, for example. The term "alkyl group" means a saturated linear or branched hydrocarbon group including, for example, methyl, ethyl, isopropyl, t-butyl, heptyl, dodecyl, octadecyl, amyl, 2-ethylhexyl, and the like. The term "alkenyl group" means an unsaturated, linear, or branched hydrocarbon group with one or more carbon-carbon double bonds, such as a vinyl group. The term "alkynyl group" means an unsaturated, linear or branched hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.).

Substitution is anticipated on the organic groups of the complexes of the present invention. As a means of simplifying the discussion and recitation of certain terminology used throughout this application, the terms "group" and "moiety" are used to differentiate between chemical species that allow for substitution or that may be substituted and those that do not allow or may not be so substituted. Thus, when the term "group" is used to describe a chemical substituent, the described chemical material includes the unsubstituted group and that group with O, N, Si, or S atoms, for example, in the chain (as in an alkoxy group) as well as carbonyl groups or other conventional substitution. Where the term "moiety" is used to describe a chemical compound or substituent, only an unsubstituted chemical material is intended to be included. For example, the phrase "alkyl group" is intended to include not only pure open chain saturated hydrocarbon alkyl substituents, such as methyl, ethyl, propyl, t-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxyalkyls, hydroxyalkyls, sulfoalkyls, etc. On the other hand, the phrase "alkyl moiety" is limited to the inclusion of only pure open chain saturated hydrocarbon alkyl substituents, such as methyl, ethyl, propyl, t-butyl, and the like.

A preferred class of phosphorus- or boron-containing complexes include the trialkylborates, trialkylphosphates, and trialkylphosphites wherein the alkyl groups are methyl or ethyl moieties. These complexes are particularly advantageous because they are volatile liquids. A preferred class of silicon-containing compounds include compounds of the formula $SiR_nH_{4-n}$ wherein n=0-4 (more preferably, $SiH_4$). These compounds are particularly advantageous because many are gases and react readily with oxidizers to form simple by-products.

If desired, adhesion of the layer to a substrate surface, or wetting properties of a layer, can be enhanced using other layers as underlayers and/or capping layers, deposited via CVD or PVD techniques. Alternatively, the substrate can be pretreated with any number of wet chemical treatments or vapor primers. See, for example, the method described by Dobson et al., *Semiconductor International*, 85-88 (1994).

The layers formed by the methods of the present invention can be used in a variety of applications. For example, they can be used in shallow trench isolation applications. As shown in FIG. 1, trenches 2 are filled with a phosphorus- and/or boron-containing silica layer 4 prepared according to the methods of the present invention.

Methods of the present invention can be used to deposit a phosphorus- and/or boron-containing silica layer, on a variety of substrates, such as a semiconductor wafer (e.g., silicon wafer, gallium arsenide wafer, etc.), glass plate, etc., and on a variety of surfaces of the substrates, whether it be directly on the substrate itself or on a layer of material deposited on the substrate as in a semiconductor substrate assembly. Methods of the present invention are particularly useful for depositing layers on the surface of a semiconductor substrate or substrate assembly, such as a silicon wafer, having a high surface area topology, such as a surface (e.g., of an insulation layer) having high aspect ratio openings (i.e., gaps) formed therein. Small high aspect ratio openings typically have feature sizes or critical dimensions below about 1 micron (e.g., the diameter or width of an opening is less than about 1 micron), and more typically, about 0.3 micron to about 1 micron, and aspect ratios greater than about 1, preferably, at least about 3:1, and more preferably, at least about 5:1. Such aspect ratios are applicable to contact holes, vias, trenches, and a variety of other configurations. For example, a trench having an opening of 1 micron and a depth of 3 microns has an aspect ratio of 3.

In preferred embodiments, the layer is deposited upon condensation followed by thermal treatment of a condensed liquid layer formed from one or more complexes selected from the group of $B(OR^3)_3$, $P(OR^4)_3$, $(O)P(OR^5)_3$, one or more sources of silicon, and one or more sources of non-silicon-containing reaction gases. Methods of the present invention utilize vapor deposition techniques, such as flash vaporization, bubbling, etc.

Figure 2:
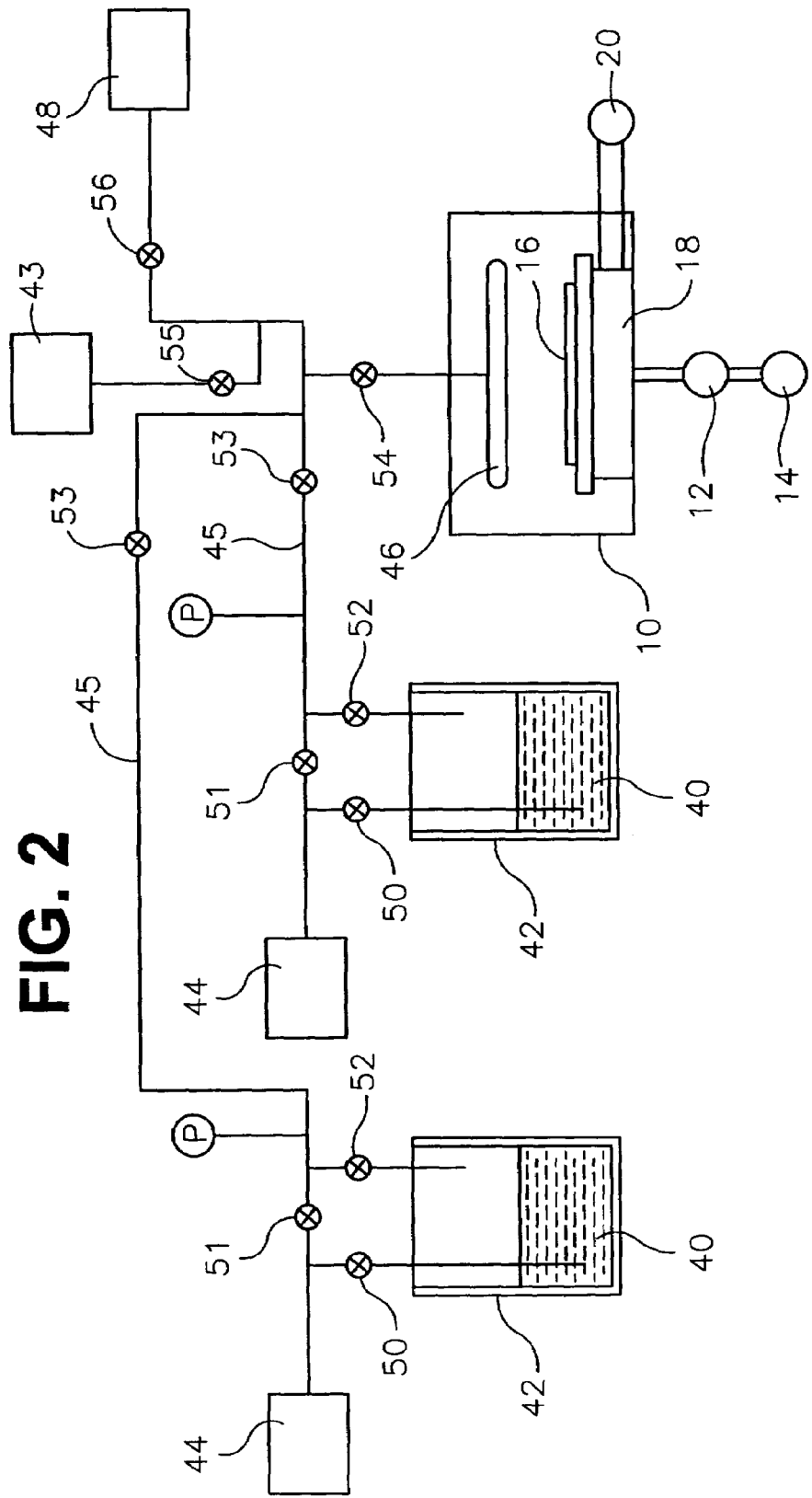
FIG. 2 is a schematic of a chemical vapor deposition system suitable for use in the methods of the present invention.

A typical chemical vapor deposition (CVD) system that can be used to perform the process of the present invention is shown in FIG. 2. The system includes an enclosed chemical vapor deposition chamber 10, which may be a cold wall-type CVD reactor. As is conventional, the CVD process may be carried out at pressures of from atmospheric pressure down to about $10^{-3}$ torr, and preferably from about 10 torr to about 0.1 torr. A vacuum may be created in chamber 10 using turbo pump 12 and backing pump 14.

One or more substrates 16 (e.g., semiconductor substrates or substrate assemblies) are positioned in chamber 10. A constant nominal temperature is established for the substrate, preferably at a temperature of about 0° C. to about 50° C., and more preferably at a temperature of about 5° C. to about 20° C. Substrate 16 may be cooled using a platen 18 cooled using coils of cool fluid circulating through a chiller 20. Other known methods of cooling the substrate may also be utilized.

In this process, one or more complexes selected from the group of $B(OR^3)_3$, $P(OR^4)_3$, $(O)P(OR^5)_3$, is stored in liquid form 40 in vessels 42. Typically, each vessel includes only one compound, although mixtures can be used. A separate inlet for a silicon source, such as $SiH_4$ is shown at 43. The silicon source could be provided in the liquid state, which could then be subjected to vaporization. A source 44 of a suitable inert gas is pumped into vessels 42 and bubbled through the neat liquid picking up the precursor and carrying it into chamber 10 through line 45 and gas distributor 46. A source of a nonsilicon reaction gas ($H_2O$ and/or $H_2O_2$) may be supplied from source 48. This may be supplied directly as a gas, or it may be subjected to a vaporizer (not shown) for volatilization if provided as a liquid. As shown, a series of valves 50-56 are opened and closed as required.

Generally, the precursor compounds in the form of reactant gases (e.g., volatilized boron- and/or phosphorus-containing complexes, nonsilicon-containing reaction gases, silicon-containing gases) are pumped into the CVD chamber 10 at a flow rate of about 1 sccm (standard cubic centimeters) to about 1000 sccm. The semiconductor substrate is exposed to the precursor composition at a pressure of about 0.001 torr to about 100 torr for a time of about 0.01 minute to about 100 minutes. In chamber 10, the reactant gases will condense on the surface of the substrate 16 and at least partially oxidize and/or hydrolyze to form a hydroxylated liquid mixture containing silicon, boron, and/or phosphorus. Typical deposition rates are about 10 Angstroms/minute to about 1000 Angstroms/minute. The liquid layer is subsequently thermally treated to drive off water and densify the layer. Typically, this occurs at a temperature of about 200° C. to about 1000° C.

Alternatives to such methods include an approach wherein the precursor compounds are heated and vapors are drawn off and controlled by a vapor mass flow controller, and a pulsed liquid injection method as described in "Metalorganic Chemical Vapor Deposition By Pulsed Liquid Injection Using An Ultrasonic Nozzle: Titanium Dioxide from Sapphire from Titanium (IV) Isopropoxide," by Versteeg, et al., *Journal of the American Ceramic Society*, 78, 2763-2768 (1995). The complexes $B(OR^3)_3$, $P(OR^4)_3$, and $(O)P(OR^5)_3$ are also particularly well suited for use with vapor deposition systems, as described in copending application U.S. Ser. No. 08/720,710 entitled "Method and Apparatus for Vaporizing Liquid Precursor compositions and System for Using Same," filed on Oct. 2, 1996. Generally, one method described therein involves the vaporization of precursor compound(s) in liquid form. In a first stage, the precursor composition is atomized or nebulized generating high surface area microdroplets or mist. In a second stage, the constituents of the microdroplets or mist are vaporized by intimate mixture of the heated carrier gas. This two stage vaporization approach provides a reproducible delivery for precursor compound(s) and provides reasonable growth rates, particularly in device applications with small dimensions.

Various combinations of carrier gases and/or reaction gases can be used in certain methods of the present invention. They can be introduced into the chemical vapor deposition chamber in a variety of manners, such as directly into the vaporization chamber.

Although specific vapor deposition processes are described by reference to FIG. 2, methods of the present invention are not limited to being used with the specific vapor deposition systems shown. Various CVD process chambers or reaction chambers can be used, including hot wall or cold wall reactors, atmospheric or reduced pressure reactors, as well as plasma enhanced reactors. Furthermore, methods of the present invention are not limited to any specific vapor deposition techniques.

The following examples are offered to further illustrate the various specific and preferred embodiments and techniques. It should be understood, however, that many variations and modifications may be made while remaining within the scope of the present invention.

EXAMPLES

BPSG Fill of STI Trenches

A silicon wafer having trenches is placed on a platen inside a CVD chamber and is cooled to 10° C. The liquid precursors, trimethylborate and trimethylphosphite, are connected to the chamber via bubblers. The precursor vapors are delivered by passing helium carrier gas through each bubbler, separately controlled by mass flow controllers, using flow rates between 50 sccm and 200 sccm. Silane ($SiH_4$) is introduced through another inlet at a flow rate of 10 sccm to 100 sccm. A 30% $H_2O_2$ solution (in water) is delivered to a flash evaporator at 0.1 mL/minute to 1 mL/minute. The chamber pressure is maintained at 1.0 torr by a gate valve between the chamber and vacuum pump. By this method, $SiO_2$ having varied quantities of boron and phosphorus could be deposited, by changing the mass flow controlled rates of delivery of each component. The resulting liquid condensates are subsequently heated to 250° C. to remove residual water, then further densified at 850° C., yielding a highly planar BPSG layer with excellent gap-fill in trenches.

The complete disclosures of all patents, patent documents, and publications listed herein are incorporated by reference, as if each were individually incorporated by reference. The foregoing detailed description and examples have been given for clarity of understanding only. No unnecessary limitations are to be understood therefrom. The invention is not limited to the exact details shown and described, for variations obvious to one skilled in the art will be included within the invention defined by the claims.

What is claimed is:

1. A method of manufacturing a semiconductor structure, the method comprising:

providing a semiconductor substrate or substrate assembly;

providing one or more sources of silicon in the form of a gas or a neat liquid;

providing one or more sources of a nonsilicon-containing reaction gas in the form of a liquid or a gas;

providing one or more sources of phosphorus and/or boron;

vaporizing each of the compounds provided as liquids to form gases;

cooling the semiconductor substrate or substrate assembly to condense gases and form a condensed liquid on a surface of the substrate or substrate assembly; and thermally treating the condensed liquid to form a phosphorus- and/or boron-containing silica layer on a surface of the semiconductor substrate or substrate assembly.

2. The method of claim 1 wherein the surface of the semiconductor substrate or substrate assembly comprises one or more small high aspect ratio openings.

3. The method of claim 1 wherein the step of vaporizing comprises using a chemical vapor deposition technique selected from the group of flash vaporization, bubbling, microdroplet formation, and combinations thereof.

4. The method of claim 1 wherein the semiconductor substrate comprises a silicon wafer or gallium arsenide wafer.

5. The method of claim 1 wherein the one or more sources of silicon are gases.

6. The method of claim 5 wherein the one or more sources of silicon gases comprise $SiH_4$.

7. The method of claim 1 wherein the one or more sources of silicon comprise compounds of the formula $SiX_pY_{4-p}$, wherein X=halide or hydrogen, Y=hydrogen, $R^1$, or $OR^2$, wherein each $R^1$ and $R^2$ group is independently an organic group, and p=0-4.

8. The method of claim 7 wherein each $R^1$ and $R^2$ group is a $(C_1-C_8)$ organic group.

9. The method of claim 8 wherein each $R^1$ and $R^2$ group is a $(C_1-C_5)$ organic group.

10. The method of claim 9 wherein each $R^1$ and $R^2$ group is a $(C_1-C_4)$ alkyl or alkenyl moiety.

11. The method of claim 1 wherein the one or more sources of a nonsilicon-containing reaction gas comprise $O_2$, $O_3$, $N_2O$, $NO_2$, NO, $H_2O$, $H_2O_2$, or mixtures thereof.

12. The method of claim 11 wherein the one or more sources of a nonsilicon-containing reaction gas comprise $H_2O$, $H_2O_2$, or a mixture thereof.

13. The method of claim 12 further comprising a step of vaporizing the $H_2O$, $H_2O_2$, or a mixture thereof to form a reaction gas.

14. The method of claim 1 wherein the phosphorus- and/or boron-containing silica layer is a PSG, BSG, or BPSG layer.

15. The method of claim 1 wherein cooling comprises cooling the substrate to a temperature of about 5° C. to about 20° C.

16. The method of claim 1 wherein the step of thermally treating comprises exposing the condensed liquid on a surface of the substrate or substrate assembly to a temperature of about 200° C. to about 1000° C.

17. A method of manufacturing a semiconductor structure, the method comprising:
providing a semiconductor substrate or substrate assembly;
providing one or more compounds of the formula $SiX_pY_{4-p}$ in the form of a gas or a neat liquid, wherein X=halide or hydrogen, Y=hydrogen, $R^1$, or $OR^2$, wherein each $R^1$ and $R^2$ group is independently an organic group, and p=0-4;
providing $H_2O$, $H_2O_2$, or a mixture thereof in liquid form;
providing one or more sources of phosphorus and/or boron;
vaporizing each of the compounds provided as liquids to form gases;
cooling the semiconductor substrate or substrate assembly to condense gases and form a condensed liquid on a surface of the substrate or substrate assembly; and
thermally treating the condensed liquid to form a phosphorus- and/or boron-containing silica layer on a surface of the semiconductor substrate or substrate assembly.

18. The method of claim 17 wherein the surface of the semiconductor substrate or substrate assembly comprises one or more small high aspect ratio openings which are filled by the condensed liquid.

19. A method of forming a silica layer on a substrate, the method comprising:
providing a substrate;
providing one or more sources of silicon in the form of a gas or a neat liquid;
providing one or more sources of a nonsilicon-containing reaction gas in the form of a liquid or a gas;
providing one or more sources of phosphorus and/or boron;
vaporizing each of the compounds provided as liquids to form gases;
cooling the substrate to condense gases and form a condensed liquid on a surface of the substrate; and
thermally treating the condensed liquid to form a phosphorus- and/or boron-containing silica layer on a surface of the substrate.

20. A method of forming a silica layer on a substrate, the method comprising:
providing a substrate;
providing one or more compounds of the formula $SiX_pY_{4-p}$ in the form of a gas or a neat liquid, wherein X=halide or hydrogen, Y=hydrogen, $R^1$, or $OR^2$, wherein each $R^1$ and $R^2$ group is independently an organic group, and p=0-4;
providing $H_2O$, $H_2O_2$, or a mixture thereof in liquid form;
providing one or more sources of phosphorus and/or boron;
vaporizing each of the compounds provided as liquids to form gases;
cooling the substrate to condense gases and form a condensed liquid on a surface of the substrate; and
thermally treating the condensed liquid to form a phosphorus- and/or boron-containing silica layer on a surface of the substrate.

21. The method of claim 1 wherein the one or more sources of phosphorus and/or boron comprise liquid compounds of the formulas $B(OR^3)_3$, $P(OR^4)_3$, $(O)P(OR^5)_3$, wherein each $R^3$, $R^4$, and $R^5$ group is independently an alkyl or alkenyl group.

22. The method of claim 21 wherein each $R^3$, $R^4$, and $R^5$ group is a $(C_1-C_8)$ alkyl or alkenyl group.

23. The method of claim 22 wherein each $R^3$, $R^4$, and $R^5$ group is a $(C_1-C_5)$ alkyl or alkenyl group.

24. The method of claim 23 wherein each $R^3$, $R^4$, and $R^5$ group is a $(C_1-C_4)$ alkyl or alkenyl moiety.

25. The method of claim 21 wherein the one or more sources of phosphorus and/or boron comprise neat liquid compounds.

26. The method of claim 17 wherein tile one or more sources of phosphorus and/or boron comprise liquid compounds of the formulas $B(OR^3)_3$, $P(OR^4)_3$, $(O)P(OR^5)_3$, wherein each $R^3$, $R^4$, and $R^5$ group is independently an alkyl or alkenyl group.

27. The method of claim 26 wherein the one or more sources of phosphorus and/or boron comprise neat liquid compounds.

28. The method of claim 19 wherein the one or more sources of phosphorus and/or boron comprise liquid compounds of the formulas $B(OR^3)_3$, $P(OR^4)_3$, $(O)P(OR^5)_3$, wherein each $R^3$, $R^4$, and $R^5$ group is independently an alkyl or alkenyl group.

29. The method of claim 28 wherein the one or more sources of phosphorus and/or boron comprise neat liquid compounds.

30. The method of claim 20 wherein the one or more sources of phosphorus and/or boron comprise liquid compounds of the formulas $B(OR^3)_3$, $P(OR^4)_3$, $(O)P(OR^5)_3$, wherein each $R^3$, $R^4$, and $R^5$ group is independently an alkyl or alkenyl group.

31. The method of claim 30 wherein the one or more sources of phosphorus and/or boron comprise neat liquid compounds.

* * * * *

UNITED STATES PATENT AND TRADEMARK OFFICE
CERTIFICATE OF CORRECTION

PATENT NO.       : 7,273,525 B2                                      Page 1 of 1
APPLICATION NO.  : 10/436640
DATED            : September 25, 2007
INVENTOR(S)      : Vaartstra It is certified that error appears in the above-identified patent and that said Letters Patent is hereby corrected as shown below:

In column 10, line 57, in Claim 26, delete "tile" and insert -- the --, therefor.

Signed and Sealed this

Twenty-seventh Day of November, 2007

JON W. DUDAS
*Director of the United States Patent and Trademark Office*